United States Patent
Chou et al.

(10) Patent No.: US 10,665,277 B2
(45) Date of Patent: May 26, 2020

(54) TIMING CALIBRATION SYSTEM AND A METHOD THEREOF

(71) Applicant: NUVOTON TECHNOLOGY CORPORATION, Hsinchu (TW)

(72) Inventors: Shih-Wen Chou, Hsinchu (TW); Shih-Chang Hsu, New Taipei (TW)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 0 days.

(21) Appl. No.: 16/374,212

(22) Filed: Apr. 3, 2019

(65) Prior Publication Data

US 2020/0118607 A1    Apr. 16, 2020

(30) Foreign Application Priority Data

Oct. 12, 2018 (TW) .............................. 107135963 A (51) Int. Cl.
*G11C 7/10* (2006.01)
*G11C 7/22* (2006.01)

(52) U.S. Cl.
CPC ............. *G11C 7/222* (2013.01); *G11C 7/106* (2013.01)

(58) Field of Classification Search
CPC .................................. G11C 8/16; G11C 16/10
USPC ............................................ 365/194, 189.04
See application file for complete search history.

(56) References Cited

U.S. PATENT DOCUMENTS

| | | | | |
|---|---|---|---|---|
| 6,426,900 B1* | 7/2002 | Maruyama | ........... | G11C 7/1051 365/189.05 |
| 6,798,990 B2* | 9/2004 | Brown | ................. | H04B 10/077 398/115 |
| 7,551,474 B2* | 6/2009 | Kim | ..................... | G11C 11/4076 365/149 |
| 7,769,942 B2* | 8/2010 | Ware | .................... | G06F 13/4022 710/317 |
| 8,504,788 B2* | 8/2013 | Stott | ...................... | G11C 7/222 711/167 |
| 8,928,420 B2* | 1/2015 | Raphaeli | ................ | H03K 4/502 331/1 R |
| 9,213,054 B2* | 12/2015 | Ware | ................. | G01R 31/31726 |
| 9,425,781 B2* | 8/2016 | Nandy | ...................... | H03K 9/08 |
| 9,865,317 B2* | 1/2018 | Ishibashi | ............... | G11C 7/1015 |
| 10,262,705 B2* | 4/2019 | Choi | ...................... | G11C 7/222 |
| 10,332,593 B2* | 6/2019 | Sasaki | ................. | G11C 11/5642 |
| 10,402,202 B2* | 9/2019 | Hong | ...................... | G11C 7/222 |
| 10,496,576 B2* | 12/2019 | Fujie | ..................... | G06F 13/385 |

(Continued)

*Primary Examiner* — Michael T Tran
(74) *Attorney, Agent, or Firm* — Muncy, Geissler, Olds & Lowe, P.C.

(57) ABSTRACT

A timing calibration system is applicable to a memory read system which includes a memory, a delay unit and a data read circuit. The memory outputs a data signal and a data latch signal. The delay unit delays the data latch signal by a delay value, to generate a read signal. The data read circuit reads the data signal according to the read signal. In the timing calibration system, a logic computation unit generates first and second charging signals according to the data signal and the read signal, and a capacitor-resistor charging unit performs charging operations according to the first and second charging signals, so as to generate first and second capacitor voltages, and a comparing unit can compare the first and second capacitor voltages, to generate a comparison result, thereby adjusting the delay value of the delay unit according to the comparison result.

10 Claims, 10 Drawing Sheets

(56) References Cited

U.S. PATENT DOCUMENTS

| | | | |
|---|---|---|---|
| 2002/0018358 A1* | 2/2002 | Kato | G11C 11/22 365/145 |
| 2002/0169922 A1* | 11/2002 | Thomann | G11C 7/22 711/100 |
| 2003/0120965 A1* | 6/2003 | Dahl | G11C 11/22 713/500 |
| 2004/0047171 A1* | 3/2004 | Roehr | G11C 29/50 365/89 |
| 2006/0052961 A1* | 3/2006 | Best | G06F 13/1689 702/106 |
| 2006/0203560 A1* | 9/2006 | Tomita | G11C 16/0475 365/185.28 |
| 2008/0037312 A1* | 2/2008 | Hamada | G11C 11/22 365/145 |
| 2009/0268520 A1* | 10/2009 | Roohparvar | G11C 16/0483 365/185.09 |
| 2009/0323414 A1* | 12/2009 | Fibranz | G11C 11/56 365/185.03 |
| 2014/0293710 A1* | 10/2014 | Ware | G11C 7/1066 365/189.02 |
| 2017/0206947 A1* | 7/2017 | Affleck | G11C 7/222 |

\* cited by examiner

TIMING CALIBRATION SYSTEM AND A METHOD THEREOF

CROSS-REFERENCE TO RELATED APPLICATION

This application claims the benefit of Taiwan Patent Application No. 107135963, filed on Oct. 12, 2018, in the Taiwan Intellectual Property Office, the disclosure of which is incorporated herein in its entirety by reference.

BACKGROUND OF THE INVENTION

1. Field of the Invention

The present invention relates to a timing calibration system and a method thereof, more particularly to a timing calibration system which is able to calibrate a phase of a read signal of a memory, and a method thereof.

2. Description of the Related Art

General memory read system includes a memory, a delay unit and a data read circuit. The memory can be a DDR memory which outputs a data signal and a data latching signal. The data signal and the data latching signal have the same phase. In order to ensure accuracy of reading data, the delay unit can delay the data latching signal according to a delay value, to generate a read signal, so as to align a rising edge and a falling edge of the read signal to a middle of a cycle of the data signal. As a result, the data read circuit can accurately read the data signal according to the read signal.

In a conventional control system, the delay unit is controlled by an external controller, and the external controller reads a delay value stored in a delay register and then controls the delay unit to delay the phase of the data latching signal, to generate read signal according to the delay value. However, the delay effect of the delay unit may be easily affected by temperature, manufacturing process or other circuit factor; in other words, even if the external controller uses the same delay value to control different delay unit, the different delay unit may perform different delay effect on the data latching signal, and the rising edge and falling edge of the read signal may align to a former half or a latter half of the data signal, and it causes the inability of the data read circuit to accurately read the data carried on the data signal.

Furthermore, since the delay effect of the delay unit may be easily affected by temperature, manufacturing process or other circuit factor, it is hard to solve the aforementioned problem even if the memory read system is calibrated before delivery.

SUMMARY OF THE INVENTION

In order to solve aforementioned problem, the present invention provides a timing calibration system to calibrate phase of a read signal of a memory, so as to improve accuracy and reliability of reading data. The present invention also provides a timing calibration method.

According to an embodiment, the present invention provides a timing calibration system which can be adapted to a memory read system comprising a memory, a delay unit and a data read circuit. The memory outputs a data signal and a data latching signal. The delay unit is configured to delay the data latching signal according to the delay value, to generate a read signal. The data read circuit is configured to read a data value of the data signal according to the read signal. The timing calibration system comprises a logic computation unit, a resistor-capacitor charging unit, and a comparing unit. The logic computation unit is configured to receive the data signal and the read signal, and generate a first charging signal and a second charging signal according to the data signal and the read signal. The resistor-capacitor charging unit is configured to receive the first charging signal and the second charging signal, and perform charging according to the first charging signal and the second charging signal, so as to generate a first capacitor voltage and a second capacitor voltage. The comparing unit is configured to compare the first capacitor voltage and the second capacitor voltage, to generate a comparison result. The delay value of the delay unit is adjusted according to the comparison result.

Preferably, the memory read system comprises a delay register to store the delay value.

Preferably, the comparing unit comprises a determining unit and an adjustment register, and the determining unit is configured to generate the comparison result, and adjust a value stored in the adjustment register according to the comparison result, and when the value stored in the adjustment register meets a calibration criterion, the delay value stored in the delay register is updated according to the value stored in the adjustment register.

Preferably, the comparing unit comprises an analog-to-digital converting circuit configured to convert the first capacitor voltage and the second capacitor voltage into a first voltage value and a second voltage value, and the determining unit compares the first voltage value and the second voltage value, to generate the comparison result.

Preferably, the comparing unit comprises a comparator configured to compare the first capacitor voltage with the second capacitor voltage, to generate the comparison result.

Preferably, the logic computation unit comprises an XNOR gate, a XOR gate and a control unit, and the control unit generates a first control signal and a second control signal to the XNOR gate and the XOR gate, respectively, and the XNOR gate generates the first charging signal according to the data signal, the read signal and the first control signal, and the XOR gate generates the second charging signal according to the data signal, the read signal and the second control signal.

Preferably, the first charging signal and the second charging signal correspond to different cycles of the data signal.

Preferably, the resistor-capacitor charging unit comprises a first resistor-capacitor charging unit and a second resistor-capacitor charging unit, the first charging signal and the second charging signal are used to trigger the first resistor-capacitor charging unit and the second resistor-capacitor charging unit to charge, respectively, so as to generate the first capacitor voltage and the second capacitor voltage.

Preferably, the first charging signal and the second charging signal correspond to the same cycle of the data signal.

According to an embodiment, the present invention provides a timing calibration method which is adapted to a memory read system comprising a memory, a delay unit and a data read circuit. The memory outputs a data signal and a data latching signal. The delay unit is configured to delay the data latching signal according to a delay value, to generate a read signal. The data read circuit is configured to read a data value of the data signal according to the read signal. The timing calibration method comprises steps of generating a first charging signal and a second charging signal according to the data signal and the read signal; providing a resistor-capacitor charging unit to receive the first charging signal and the second charging signal, and perform charging according to the first charging signal and the second charging signal, so as to generate a first capacitor voltage and a second capacitor voltage; providing a comparing unit to compare the first capacitor voltage and the second capacitor voltage, to generate a comparison result; and adjusting the delay value of the delay unit according to the comparison result.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1:
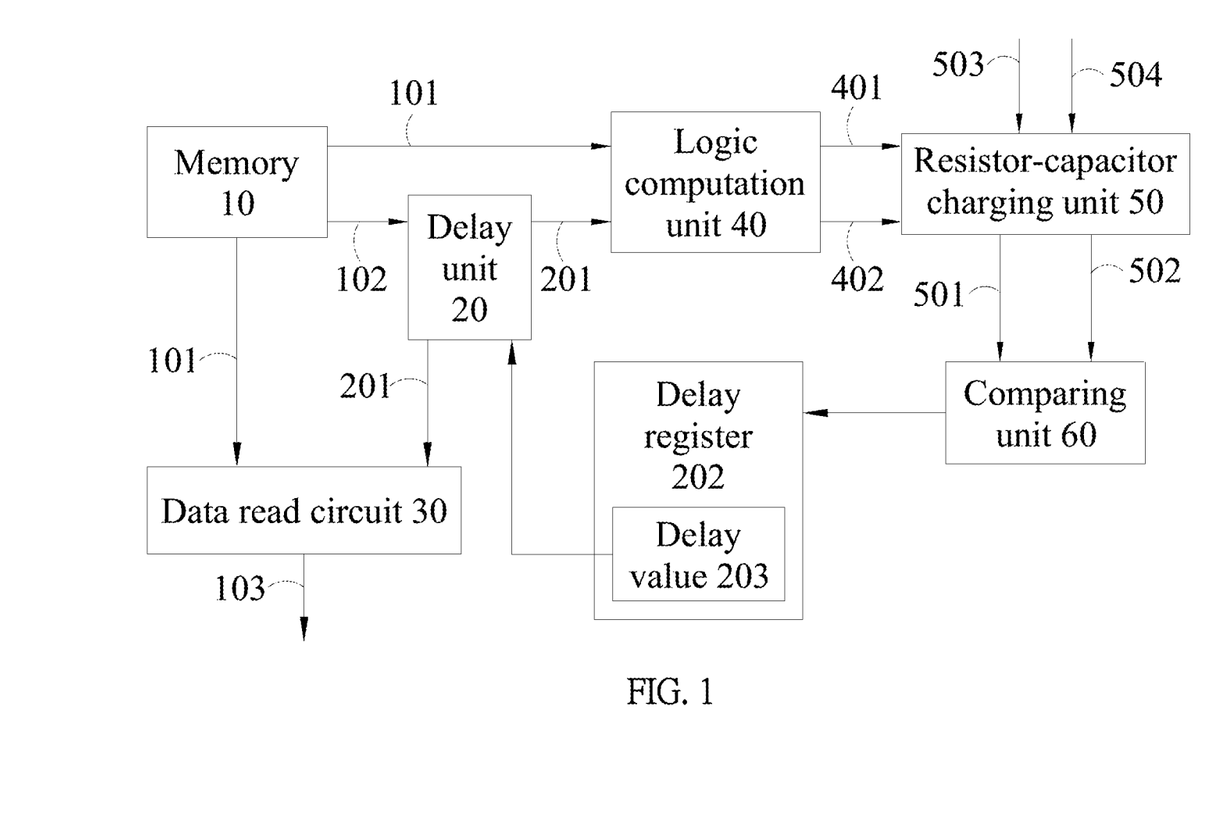
FIG. 1 is a block diagram of a timing calibration system of the present invention.
Figure 2:
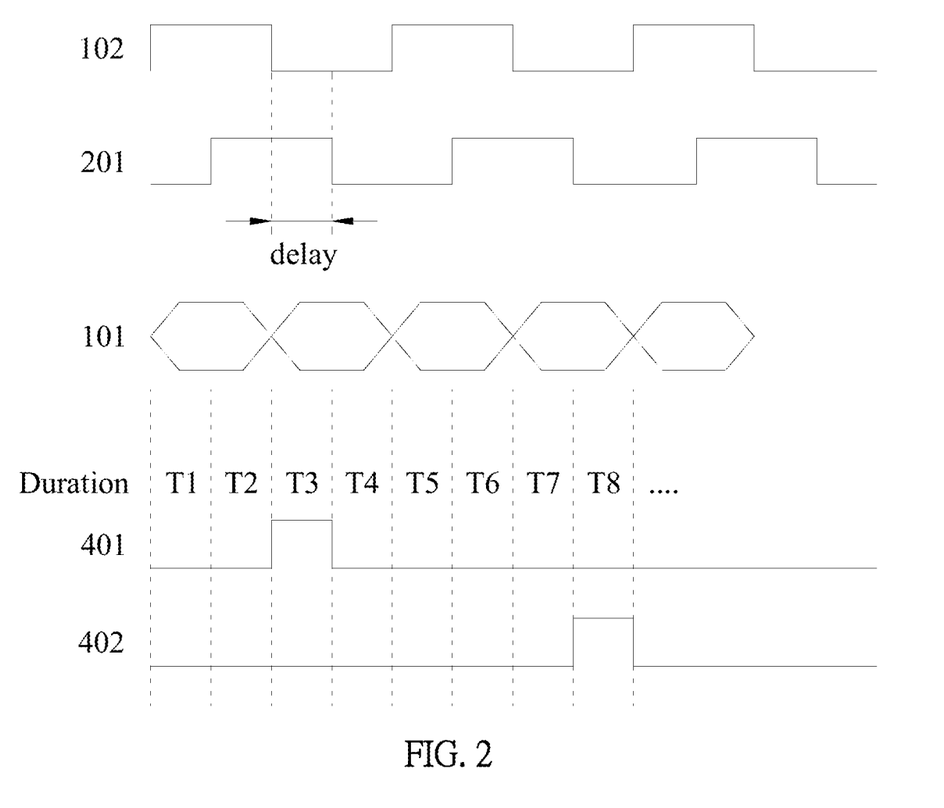
FIG. 2 is a waveform diagram showing a plurality of signals of a timing calibration system of the present invention.
Figure 4:
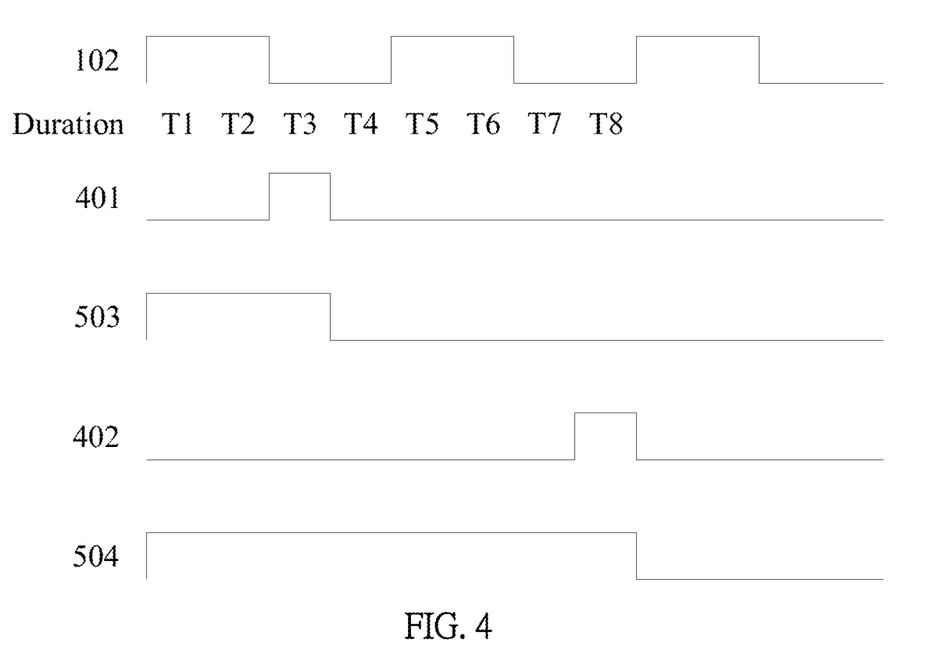
FIG. 4 is a s waveform diagram showing charging signals and enable signals of a timing calibration system of the present invention.

Please refer to FIGS. 1, 2 and 4, which shows a block diagram of a timing calibration system, a schematic timing view of a plurality of signals, and a schematic timing view of charging signals and enable signals of the present invention, respectively. The timing calibration system of the present invention is applicable to a memory read system, and the memory read system comprises a memory 10, a delay unit 20 and a data read circuit 30. The memory 10 can output a data signal 101 and a data latching signal 102. The delay unit 20 can delay the data latching signal 102 to generate a read signal 201 according to a delay value 203. The data read circuit 30 can read a data value 103 of the data signal 101 according to the read signal 201. The timing calibration system comprises a logic computation unit 40, a resistor-capacitor charging unit 50, and a comparing unit 60.

The logic computation unit 40 can receive the data signal 101 and the read signal 201, and generate a first charging signal 401 and a second charging signal 402 according to the data signal 101 and the read signal 201. The resistor-capacitor charging unit 50 can receive the first charging signal 401 and the second charging signal 402, and perform charging operation according to the first charging signal 401 and the second charging signal 402, so as to generate a first capacitor voltage 501 and a second capacitor voltage 502.

Figure 3:
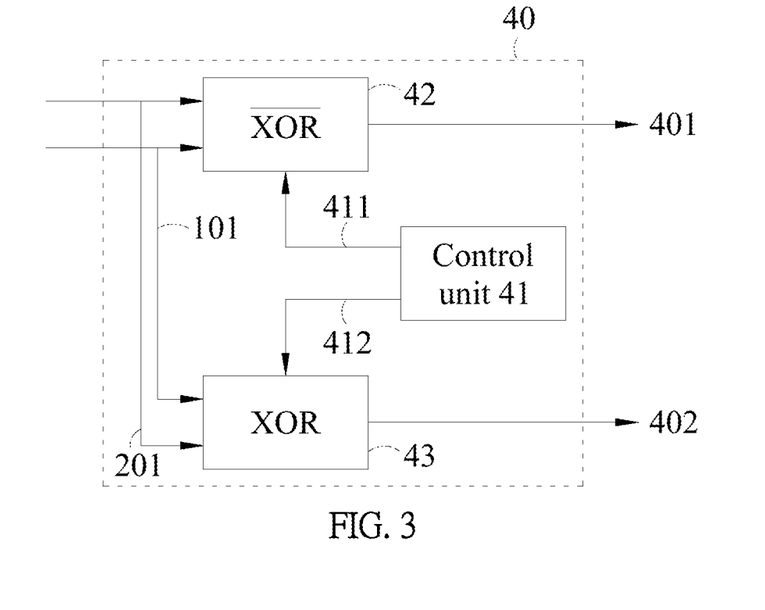
FIG. 3 is a block diagram of an embodiment of a logic computation unit of a timing calibration system of the present invention.

Please refer to FIGS. 2 to 4. FIG. 2 is a waveform diagram showing the data latching signal 102, the read signal 201, the data signal 101, the durations T1 to T8 of the data signal 101, the first charging signal 401 and the second charging signal 402. FIG. 3 shows a block diagram of an embodiment of a logic computation unit 40. FIG. 4 is a waveform diagram showing the data latching signal 102, the durations T1 to T8 of the data signal 101, the first charging signal 401, the first enable signal 503, the second charging signal 402 and the second enable signal 504.

In an embodiment, as shown in FIG. 3, the logic computation unit 40 can comprise an XNOR gate 42, a XOR gate 43 and a control unit 41. The control unit 41 generates a first control signal 411 and a second control signal 412 to the XNOR gate 42 and the XOR gate 43, respectively. In an embodiment, the first control signal 411 and the second control signal 412 are configured to enable the XNOR gate 42 and the XOR gate 43 to generate the first charging signal 401 and the second control signal 412 corresponding to different durations of the data signal 101. That is, the first control signal 411 and the second control signal 412 can make the pulses of first charging signal 401 and the second control signal 412 occur in different cycles of the data signal 101, for example, as shown in FIG. 2, the pulse of the first charging signal 401 occurs in the duration T3, and the pulse of the second control signal 412 occurs in the duration T8.

According to the data signal 101, the read signal 201 and the first control signal 411, the XNOR gate 42 can generate the first charging signal 401. For example, in response to the first control signal 411, the XNOR gate 42 only outputs the output signal in the durations T3 and T4; in an embodiment, in the durations T3 and T4, the data values 103 of the data signal 101 are 1 and 1, respectively, and the values of the read signal 201 are 1 and 0, respectively, so the values of the first charging signal 401 outputted from the XNOR gate 42 are 1 and 0 in the durations T3 and T4, as shown in FIG. 2. Similarly, in response to the second control signal 412, the XOR gate 43 can output signal in the durations T7 and T8 only; and, in the durations T7 and T8, the second charging signal 402 outputted from the XOR gate 43 are 0 and 1, respectively, as shown in FIG. 2.

It should be noted that the above description is merely for an exemplary illustration, and the present invention is not limited thereto. For example, the first control signal 411 and the second control signal 412 can also be used to activate calculation of the first charging signal 401 and the second charging signal 402 according to the data value of the data signal 101 and a predetermined rule, for example, the predetermined rule can be that the calculation for the first charging signal 401 and the second charging signal 402 is activated in durations of different cycles of the data signal 101, respectively, as shown in FIG. 2, the pulse of the first charging signal 401 and the second charging signal 402 occur in the duration T3 and the duration T8, respectively. In an embodiment, the calculation of the first charging signal 401 and the second charging signal 402 can be activated when the data value is equal to a predetermined value such as 1 or 0. For example, as shown in FIG. 2, the calculation of the first charging signal 401 and the second charging signal 402 is activated only when the data value is 1; however, the present invention is not limit thereto.

The resistor-capacitor charging unit 50 includes a charging circuit formed by at least one capacitor and at least one resistor. When the pulse of the first charging signal 401 occurs, the capacitor starts to charge at a rising edge of the pulse, and stops charging at a falling edge of the pulse, thereby obtaining the capacitor voltage corresponding to a pulse width. When the first capacitor voltage 501 is the same as the second capacitor voltage 502, it indicates that the pulse width of the first charging signal 401 and the pulse width of the second charging signal 402 are the same, and also indicates that the rising edge and falling edge of the read signal 201 align to the middle of a cycle of the data signal 101. When the rising edge and falling edge of the read signal 201 align to the middle of a cycle of the data signal 101, the accuracy and reliability of reading data of the memory can be effectively improved.

It should be noted that in actual application, when the timing calibration system includes single resistor-capacitor charging unit, it is preferred that the calculation of the first charging signal 401 and the second charging signal 402 is activated in different cycles of the data signal 101; alternatively, when the calibrate system includes two resistor-capacitor charging units, the calculation of the first charging signal 401 and the second charging signal 402 can be activated in the same cycle of the data signal 101. When the timing calibration system includes single resistor-capacitor charging unit, the charging voltages generated in two separate charging operations can be more accurate; and when the timing calibration system includes two resistor-capacitor charging units, the electrical characteristics of the two resistor-capacitor charging units may be slightly different, so the variation between the charging voltages generated by two charging operations is higher. In actual application, the two resistor-capacitor charging units can be located adjacent to each other as much as possible, so as to reduce the variance between the electrical characteristics of the two resistor-capacitor charging units.

The delay unit 20 can delay the data latching signal 102 according to the delay value 203, to generate the read signal 201. Since the delay effect of the delay unit 20 may be easily affected by variation of temperature or manufacturing process, the rising edge and falling edge of the read signal 201 may not align to the middle of the data signal 101 even the read signal 201 is delayed by the same delay value 203, and it may reduce the accuracy and reliability of reading data of the memory.

In order to solve this problem, the comparing unit 60 determines, according to the first capacitor voltage 501 and the second capacitor voltage 502, whether the rising edge and falling edges of the read signal 201 align to the middle of a cycle of the data signal 101. When the first capacitor voltage 501 is substantially equal to the second capacitor voltage 502, it indicates that the pulse width of the first charging signal 401 and the pulse width of the second charging signal 402 are substantially the same, and also indicates the rising edge or falling edge of the read signal 201 substantially aligns to the middle of each cycle of the data signal 101. When the first capacitor voltage 501 is lower than the second capacitor voltage 502, it indicates that the pulse width of the first charging signal 401 is shorter than the pulse width of the second charging signal 402, and also indicates that the rising edge or falling edge of the read signal 201 aligns to the former half of each cycle of the data signal 101. As a result, the comparing unit 60 can determine that the delay unit 20 delays the data latching signal 102 not enough. When the first capacitor voltage 501 is higher than the second capacitor voltage 502, it indicates the pulse width of the first charging signal 401 is longer than the pulse width of the second charging signal 402, and also indicates that the rising edge or falling edge of the read signal 201 aligns to the latter half of each cycle of the data signal 101. As a result, the comparing unit 60 can determine that the delay unit 20 excessively delays the data latching signal 102.

The comparing unit 60 can compare the first capacitor voltage 501 and the second capacitor voltage 502 to generate a comparison result 641, such as one of aforementioned three conditions. The delay value 203 stored in a delay register 202 can be adjusted according to the comparison result 641, so as to align the rising edge or falling edge of the read signal 201 to the middle of each cycle of the data signal 101, thereby effectively improving the accuracy and reliability of reading data of the memory.

The charging operation of the resistor-capacitor circuit can satisfy an equation below:

$$V(t) = V\left(1 - e^{-\frac{t}{RC}}\right)$$

wherein R is a resistance value of the resistor-capacitor circuit, C is a capacitance value of a capacitor of the resistor-capacitor circuit, t is a period of charging, V(t) is a capacitor voltage of the capacitor after the charging operation is performed for a period of t. In the embodiment, t also indicates the pulse width of the charging signal. A DDR memory is taken as an example for illustration below.

It is assumed that the operation clock of the DDR memory is 300 MHz, the cycle of the data signal 101 is 1 ns (that is, t=1 ns). When the resistance value is 100Ω and the capacitance value is 100 pF, the value of (−t/RC) is calculated as −0.1. After charging operations of 1.0 ns, 1.2 ns and 5 ns are performed, the capacitor voltages are 171 my, 206 mV and 708 mV, respectively. The calculation formulas are shown below:

$$V(1.0 \text{ ns})=1.8(1-e^{-0.1})=171 \text{ mV}$$

$$V(1.2 \text{ ns})=1.8(1-e^{-0.12})=206 \text{ mV}$$

$$V(5 \text{ ns})=1.8(1-e^{-0.5})=708 \text{ mV}$$

When the resistance value is 100Ω and the capacitance value is 10 pF, the value of (−t/RC) can be calculated as −1. After charging operations of 1.0 ns, 1.2 ns and 5 ns are performed, the capacitor voltages are 1.137 V, 1.257 V and 1.787 V, respectively. The calculation formulas are shown below:

$$V(1.0 \text{ ns})=1.8(1-e^{-1})=1.137 \text{ V}$$

$$V(1.2 \text{ ns})=1.8(1-e^{-12})=1.257 \text{ V}$$

$$V(5 \text{ ns})=1.8(1-e^{-5})=1.787 \text{ V (almost saturated)}$$

When the resistance value is 10Ω and the capacitance value is 10 pF, the value of (−t/RC) can be calculated as −10. After charging operations of 1.0 ns, 1.2 ns and 5 ns are performed, the capacitor voltages are 1.799 V, 1.799 V and 1.8 V, respectively. The calculation formulas are shown below:

$$V(1.0 \text{ ns})=1.8(1-e^{-10})=1.799 \text{ V (almost saturated)}$$

$$V(1.2 \text{ ns})=1.8(1-e^{-12})=1.799 \text{ V (almost saturated)}$$

$$V(5 \text{ ns})=1.8(1-e^{-50})=1.8 \text{ V (saturated)}$$

According to aforementioned three examples, when the resistance value and capacitance value of the resistor-capacitor charging unit are set appropriately, even if the difference between charging periods is 0.2 ns, the comparing unit 60 can still obtain a voltage difference of 0.12 V which is high enough to serve as the basis of adjusting the delay value 203. When the resistance value and capacitance value of the resistor-capacitor charging unit are not set appropriately, the voltage difference may be too low, for example, in the setting of the resistance value and capacitance value of the first example, when difference of two charging periods is 0.2 ns, the comparing unit 60 can obtain the voltage difference of 35 mV which is too low to serve as the basis of adjusting the delay value 203; in the setting set of the resistance value and capacitance value of the third example, in a condition that difference of two charging periods is 0.2 ns, the comparing unit 60 cannot obtain a voltage difference for determining whether to adjust the delay value 203.

The delay value 203 stored in the delay register 202 can be adjusted according to the comparison result 641. In an embodiment, the delay value 203 can be adjusted in real time; in an embodiment, a register and a calibration criterion can be additionally set for adaptive adjustment.

Figure 5:
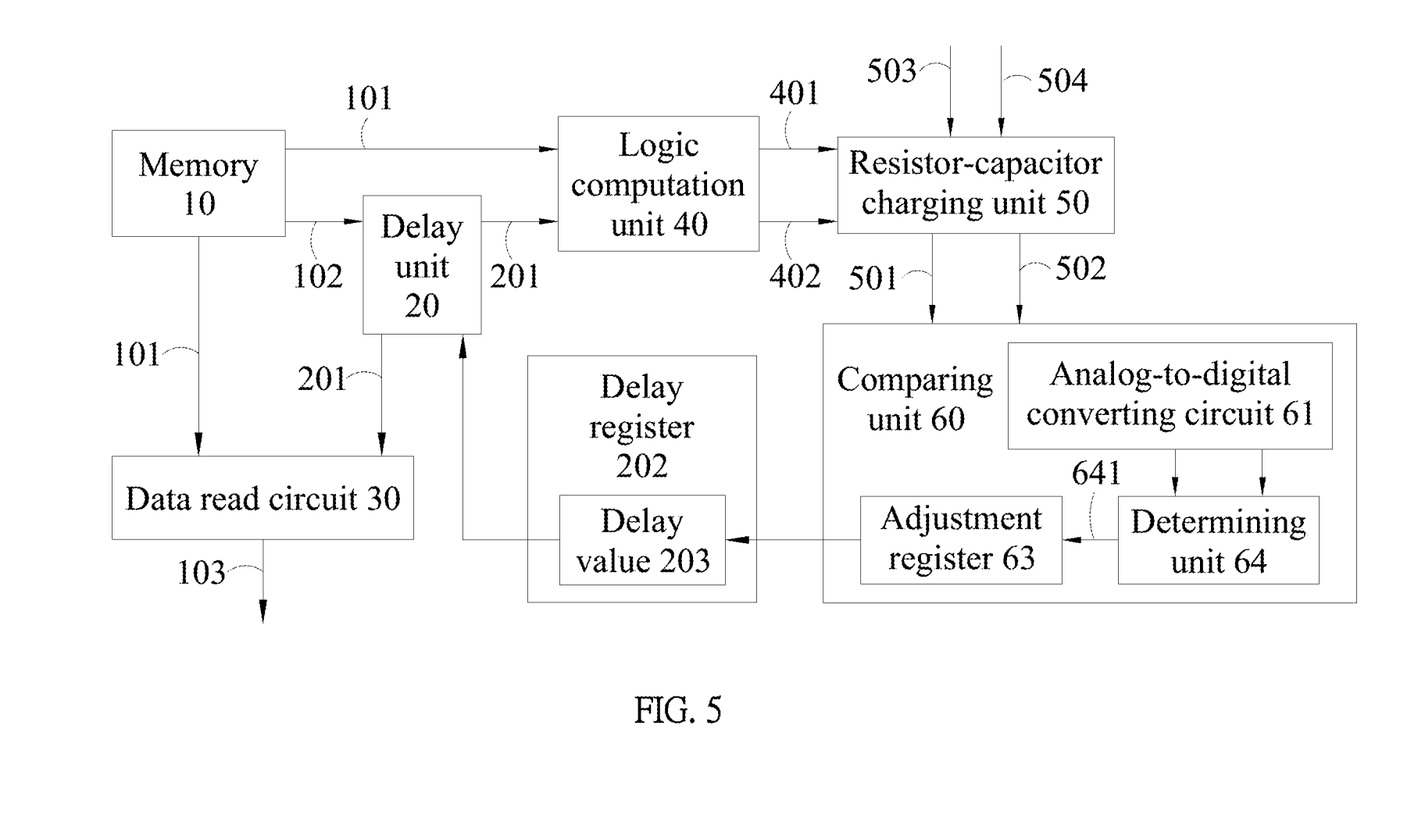
FIG. 5 is a schematic view of an embodiment of a timing calibration system of the present invention.

Please refer to FIG. 5, which shows a schematic view of an embodiment of a timing calibration system of the present invention. In the embodiment, the comparing unit 60 comprises an analog-to-digital converting circuit 61, a determining unit 64 and an adjustment register 63. The analog-to-digital converting circuit 61 can convert the first capacitor voltage 501 and the second capacitor voltage 502 into a first voltage value and a second voltage value, the determining unit 64 can compare the first voltage value with the second voltage value, to generate the comparison result 641, and then adjust the value stored in the adjustment register 63 according to the comparison result 641. When the value stored in the adjustment register 63 meets a calibration criterion, the delay value 203 stored in the delay register 202 can be updated according to the value stored in the adjustment register 63.

In this embodiment, the calibration criterion is that the value stored in the adjustment register 63 is higher than a threshold value. When the value stored in the adjustment register 63 is higher than a threshold value, the delay value 203 stored in the delay register 202 is updated according to the value stored in the adjustment register 63. In an embodiment, the calibration criteria can be that variation of an average of the value stored in the adjustment register 63 is lower than the threshold value, and the delay value 203 stored in the delay register 202 can be updated according to the average of the value stored in the adjustment register 63.

In actual application, the delay unit 20 is controlled by an external controller, and the external controller can read the delay value 203 stored in the delay register 202, and then control the delay unit 20 to delay the phase of the data latching signal 102 according to the delay value 203, to generate read signal 201. In some applications, if the delay value 203 is updated frequently, the entire system may be unstable. Therefore, the embodiment shown in FIG. 5 can solve the problem. As shown in FIG. 5, an adjustment register 63 and a calibration criteria are additionally set to implement the adaptive adjustment of the delay value 203, so as to prevent the excessively frequently adjustment of the delay value 203. However, the present invention is not limited to above example.

Figure 6:
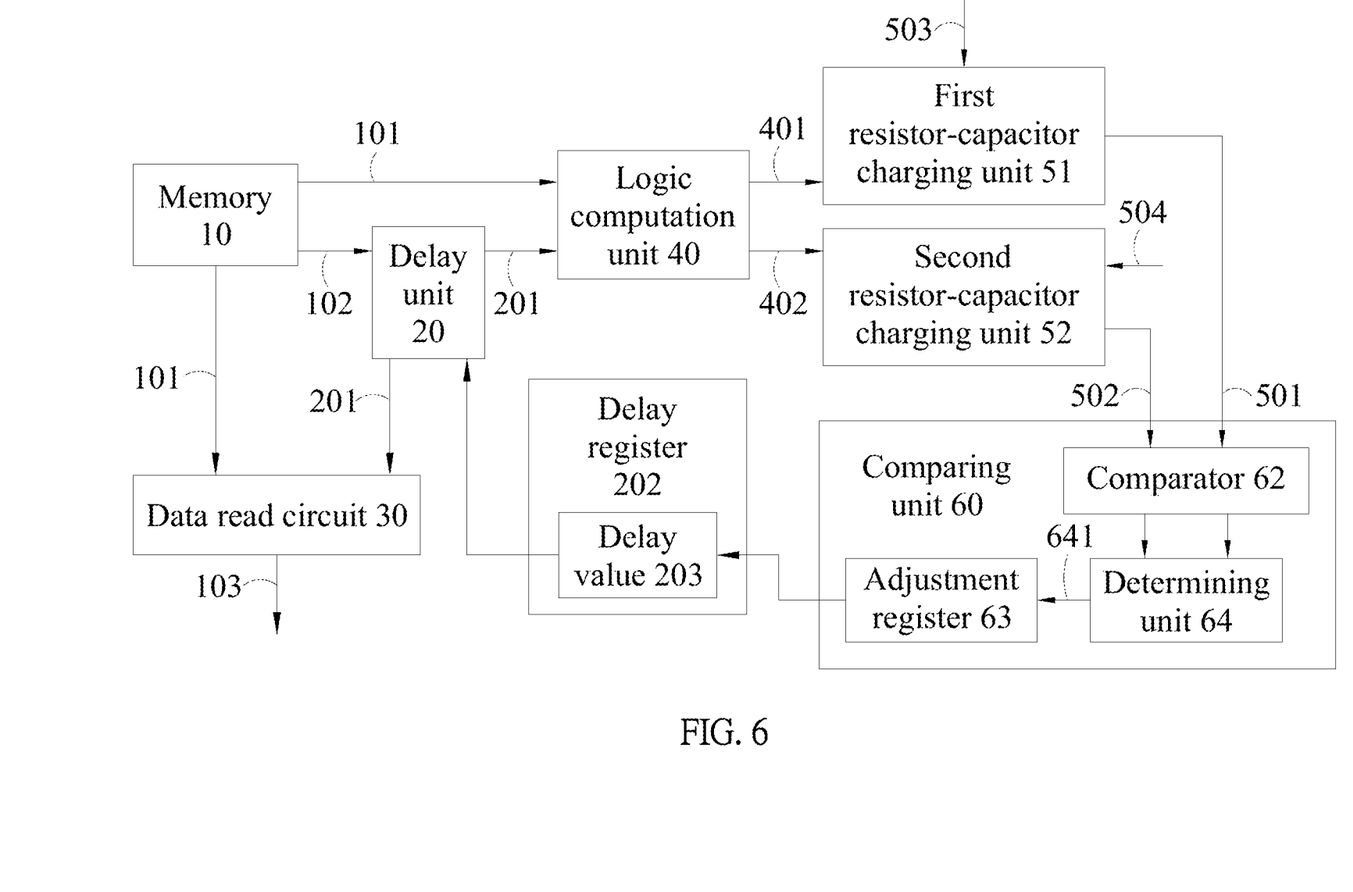
FIG. 6 is a schematic view of another embodiment of a timing calibration system of the present invention.
Figure 7:
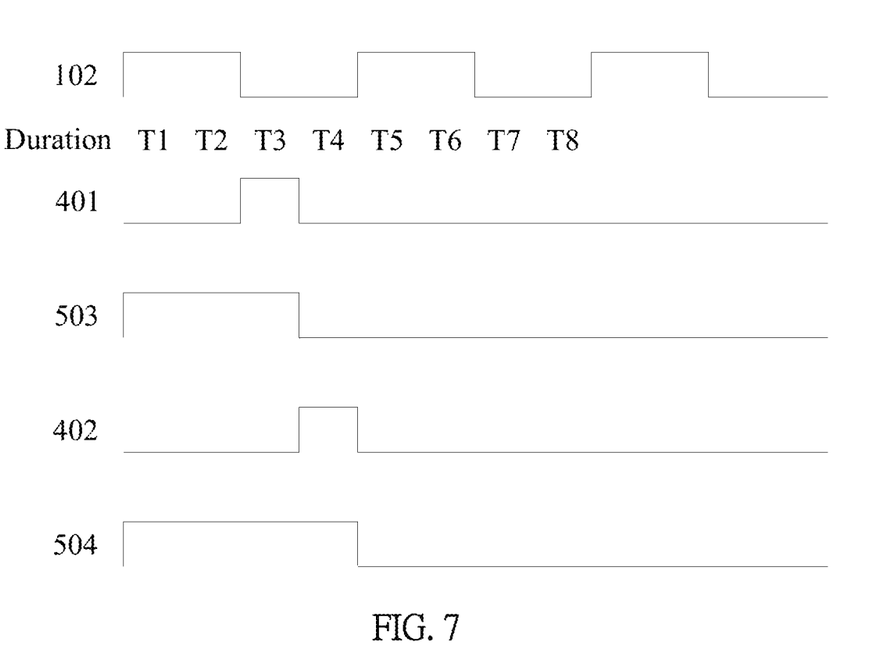
FIG. 7 is a waveform diagram showing charging signals and enable signals of an embodiment of a timing calibration system of the present invention.

Please refer to FIGS. 6 and 7, which show a schematic view of another embodiment of a timing calibration system of the present invention and a schematic timing diagram of charging signals and enable signals of an embodiment of a timing calibration system of the present invention, respectively. In the embodiment, the memory read system comprises the memory 10, the delay unit 20 and the data read circuit 30, and the timing calibration system comprises the logic computation unit 40, a first resistor-capacitor charging unit 51, a second resistor-capacitor charging unit 52, a comparator 62, an adjustment register 63, and a determining unit 64. The comparing unit 60 includes the comparator 62, the adjustment register 63, and the determining unit 64.

In this embodiment, the first charging signal 401 and the second charging signal 402 are configured to trigger the first resistor-capacitor charging unit 51 and the second resistor-capacitor charging unit 52 to charge, respectively, so as to generate the first capacitor voltage 501 and the second capacitor voltage 502. The pulses of the first charging signal 401 and the second charging signal 402 can be located in the same cycle of the data signal 101, as shown in FIG. 7. The first enable signal 503 can be at high logic level during durations T1 to T3 of the data latching signal 102, and at low logic level during other durations; and, the second enable signal 504 can be at high logic level during durations T1 to T4 of the data latching signal 102, and at low logic level during other durations. In actual application, the first resistor-capacitor charging unit 51 and the second resistor-capacitor charging unit 52 can be located adjacent to each other in layout, so as to reduce the variance between the electrical characteristics of the two resistor-capacitor charging units.

The comparator 62 is configured to compare the first capacitor voltage 501 and the second capacitor voltage 502, so as to generate the comparison result 641. The determining unit 64 can modify the value stored in the adjustment register 63 according to the comparison result 641, and the delay value 203 stored in the delay register 202 can be updated according to the value stored in the adjustment register 63, as shown in FIG. 6. In another embodiment, the determining unit 64 can directly update the delay value 203 stored in the delay register 202 according to the comparison result 641.

Figure 8:
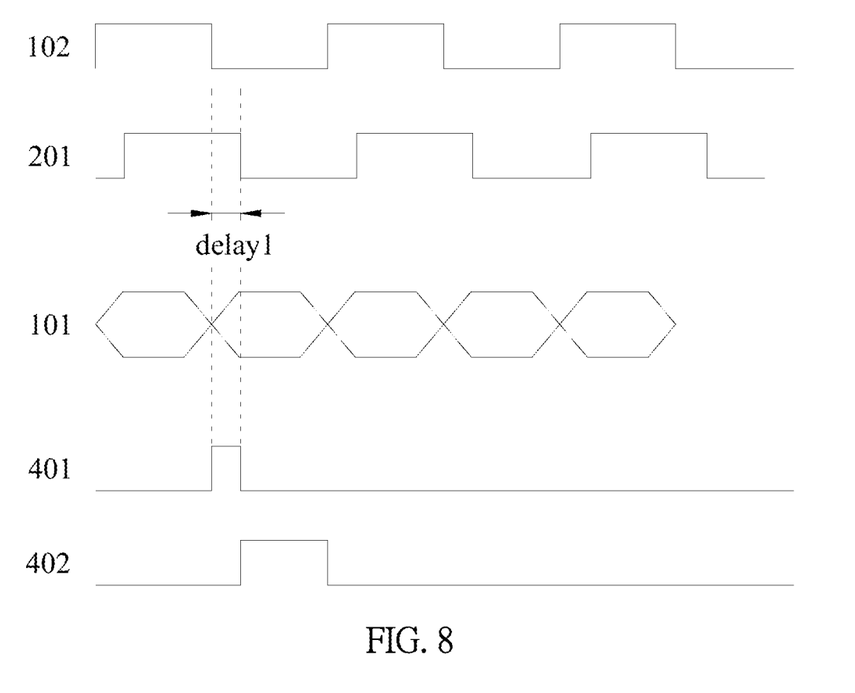
FIG. 8 is a schematic view of an operational state of a timing calibration system of the present invention.
Figure 9:
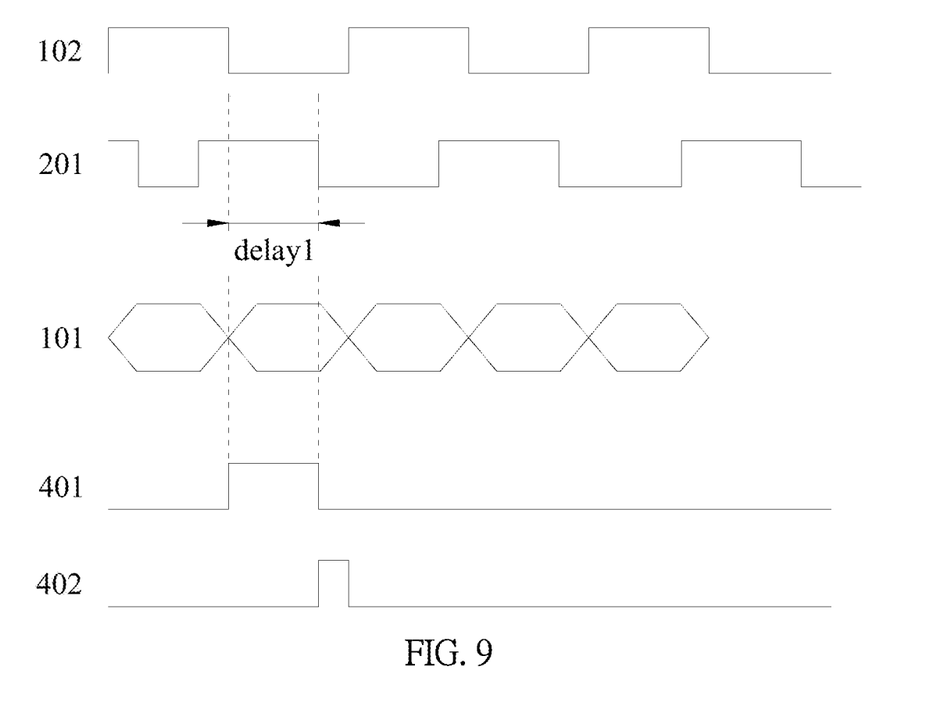
FIG. 9 is a schematic view of another operational state of a timing calibration system of the present invention.

Please refer to FIGS. 8 and 9, which show schematic views of two operational states of the timing calibration system of the present invention, respectively. The external controller reads the predetermined delay value 203 stored in the delay register 202 and controls the delay unit 20, to delay the phase of the data latching signal 102 according to the predetermined delay value 203, so as to generate the read signal 201. The delay unit 20 may be affected by temperature, manufacturing process or other circuit factor, when the actual delay is not enough, the falling edge or the rising edge of the read signal 201 aligns to the former half of the cycle of the data signal 101, and in this case, the pulse width of the first charging signal 401 is less than that of the second charging signal 402. By using the resistor-capacitor charging unit 50 or using both of the first resistor-capacitor charging unit 51 and the second resistor-capacitor charging unit 52, the comparing unit 60 can determine that the delay is not enough according to the first capacitor voltage 501 and the second capacitor voltage 502, and then increase the delay value 203 for calibrating the phase of the read signal 201 until the rising edge or the falling edge of the read signal 201 substantially align to the middle of a cycle of the data signal 101.

Similarly, as shown in FIG. 9, the delay unit 20 excessively delays the phase of the data latching signal 102, so the rising edge or the falling edge of the read signal 201 aligns to the latter half of a cycle of the data signal 101, and in this case, the pulse width of the first charging signal 401 is longer than the pulse width of the second charging signal 402. By using the resistor-capacitor charging unit 50, or using both of the first resistor-capacitor charging unit 51 and the second resistor-capacitor charging unit 52, the comparing unit 60 can determine that the data latching signal 102 is excessively delayed according to the first capacitor voltage 501 and the second capacitor voltage 502, and then decrease the delay value 203 for calibrating the phase of the read signal 201 until the falling edge or the rising edge of the read signal 201 substantially aligns to the middle of a cycle of the data signal 101.

It should be noted that the timing calibration system of the present invention can include a calibration mode and predetermined calibration data. When the timing calibration system enters the calibration mode, the data signal 101 outputted from the memory 10 carries the predetermined calibration data, for example, the calibration data can be "0101010101010101", so as to improve the calibration efficiency. The timing calibration system can periodically enter the calibration mode for calibrating the variance of the delay unit caused by the temperature or external environmental factor. In an embodiment, the timing calibration system does not have the calibration mode, and the comparing unit anytime determines whether the read signal aligns to the data signal, and responds according to the comparison result.

Figure 10:
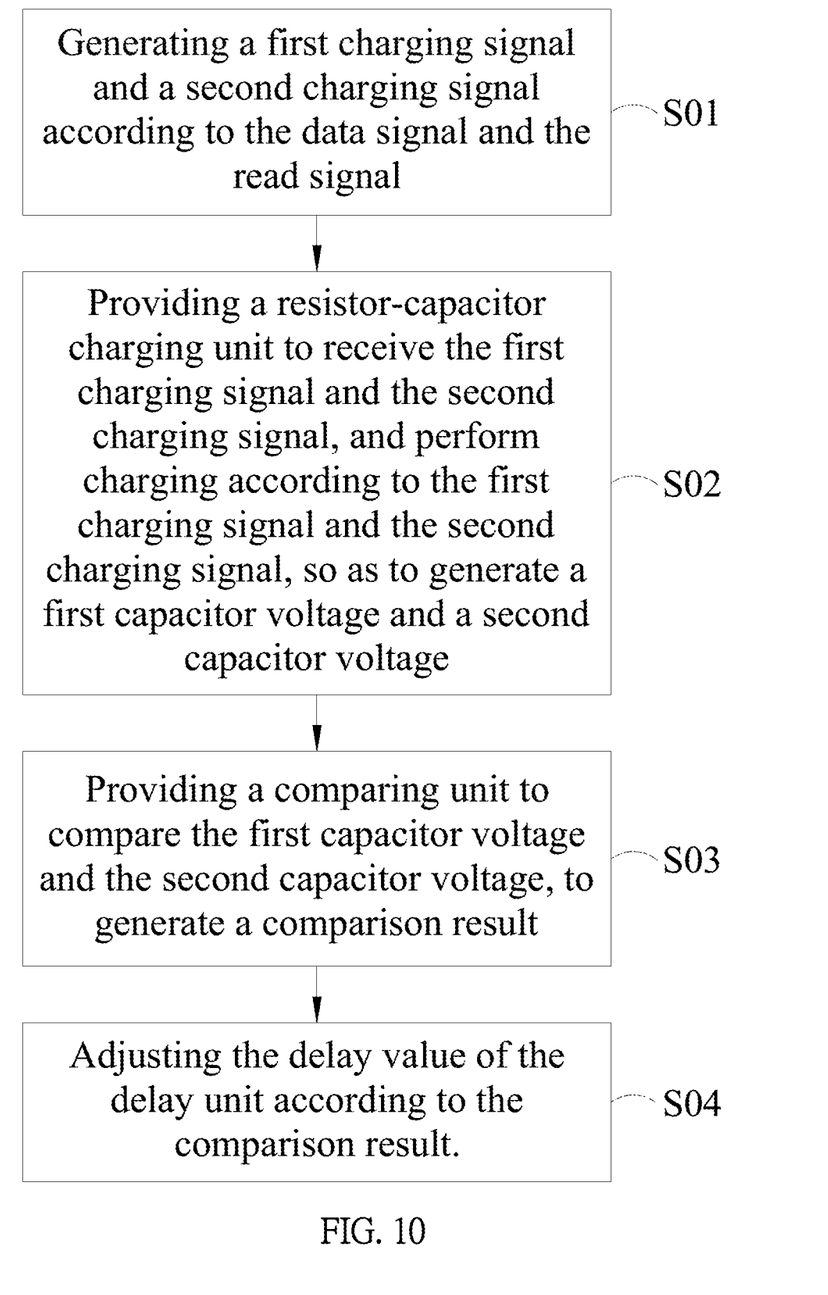
FIG. 10 is a flow chart of a timing calibration method of the present invention.

Please refer to FIG. 10, which shows a flow chart of a timing calibration method of the present invention. The timing calibration method can be adapted to the memory read system including the memory, the delay unit and the data read circuit. The memory outputs the data signal and the data latching signal, the delay unit delays the data latching signal according to the delay value, to generate the read signal. The data read circuit reads the data value of the data signal according to the read signal. As shown in FIG. 10, the timing calibration method comprises steps S01 to S04. In a step S01, the first charging signal and the second charging signal are generated according to the data signal and the read signal. In a step S02, the resistor-capacitor charging unit is provided to receive the first charging signal and the second charging signal, and perform charging operation according to the first charging signal and the second charging signal, so as to generate the first capacitor voltage and the second capacitor voltage.

In a step S03, the comparing unit is provided to compare the first capacitor voltage and the second capacitor voltage, to generate the comparison result. In a step S04, the delay value of the delay unit is adjusted according to the comparison result.

In an embodiment, when the number of the resistor-capacitor charging unit is one, the first charging signal and the second charging signal correspond to different cycles of the data signal, the resistor-capacitor charging unit performs charging at different cycles, to generate the first capacitor voltage and the second capacitor voltage, respectively. When the number of the resistor-capacitor charging units is multiple, the first charging signal and the second charging signal can correspond to the different cycles or the same cycle of the data signal, and when the first charging signal and the second charging signal correspond to the same cycle of the data signal, the first resistor-capacitor charging unit and the second resistor-capacitor charging unit can perform charging during one cycle of data signal, to generate the first capacitor voltage and the second capacitor voltage, respectively.

In an embodiment, the memory read system can comprise the delay register to store the delay value, and adjust the delay value of the delay unit according to the comparison result. In an embodiment, after the comparing unit generates the comparison result, the delay value can be updated in real time. In an embodiment, the comparing unit comprises the adjustment register, and after the value stored in the adjustment register meets the calibration criteria, the value stored in the adjustment register can be used to update the delay value stored in the delay register; for example, after the value stored in adjustment register exceeds the threshold value or the value stored in adjustment register is averaged for preset times, the value stored in adjustment register can be used to update the delay value stored in the delay register.

In an embodiment, the comparing unit can comprise the comparator or the analog-to-digital converting circuit. For example, when the number of the resistor-capacitor charging units is multiple, the comparing unit can comprise the comparator configured to directly compare the first capacitor voltage and the second capacitor voltage, so as to generate the comparison result. When the number of the resistor-capacitor charging unit is one, the comparing unit can comprise the analog-to-digital converting circuit configured to convert the first capacitor voltage and the second capacitor voltage into the first voltage value and the second voltage value, and the determining unit can compare the first voltage value with the second voltage value to generate the comparison result.

In an embodiment, the logic computation unit can comprise an XNOR gate (XOR), an XOR gate and a control unit. The control unit generates a first control signal and a second control signal to the XNOR gate and the XOR gate, respectively. The XNOR gate generates the first charging signal according to the data signal, the read signal and the first control signal. The XOR gate can generate the second charging signal according to the data signal, the read signal and the second control signal.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A timing calibration system, adapted to a memory read system comprising a memory, a delay unit and a data read circuit, wherein the memory outputs a data signal and a data latching signal, the delay unit is configured to delay the data latching signal according to a delay value, to generate the read signal, and the data read circuit is configured to read a data value of the data signal according to the read signal, and the timing calibration system comprises:
    a logic computation unit configured to receive the data signal and the read signal, and generate a first charging signal and a second charging signal according to the data signal and the read signal;
    a resistor-capacitor charging unit configured to receive the first charging signal and the second charging signal, and perform charging according to the first charging signal and the second charging signal, so as to generate a first capacitor voltage and a second capacitor voltage; and
    a comparing unit configured to compare the first capacitor voltage with the second capacitor voltage, to generate a comparison result, wherein the delay value of the delay unit is adjusted according to the comparison result.

2. The timing calibration system according to claim 1, wherein the memory read system comprises a delay register to store the delay value.

3. The timing calibration system according to claim 2, wherein the comparing unit comprises a determining unit and an adjustment register, and the determining unit is configured to generate the comparison result, and adjust a value stored in the adjustment register according to the comparison result, and when the value stored in the adjustment register meets a calibration criterion, the delay value stored in the delay register is updated according to the value stored in the adjustment register.

4. The timing calibration system according to claim 3, wherein the comparing unit comprises an analog-to-digital converting circuit configured to convert the first capacitor voltage and the second capacitor voltage into a first voltage value and a second voltage value, and the determining unit compares the first voltage value with the second voltage value, to generate the comparison result.

5. The timing calibration system according to claim 1, wherein the comparing unit comprises a comparator configured to compare the first capacitor voltage and the second capacitor voltage, to generate the comparison result.

6. The timing calibration system according to claim 1, wherein the logic computation unit comprises an XNOR gate, an XOR gate and a control unit, the control unit generates a first control signal and a second control signal to the XNOR gate and the XOR gate, respectively, and the XNOR gate generates the first charging signal according to the data signal, the read signal and the first control signal, and the XOR gate generates the second charging signal according to the data signal, the read signal and the second control signal.

7. The timing calibration system according to claim 1, wherein the first charging signal and the second charging signal correspond to different cycles of the data signal.

8. The timing calibration system according to claim 1, wherein the resistor-capacitor charging unit comprises a first resistor-capacitor charging unit and a second resistor-capacitor charging unit, the first charging signal and the second charging signal are used to trigger the first resistor-capacitor charging unit and the second resistor-capacitor charging unit to charge, respectively, so as to generate the first capacitor voltage and the second capacitor voltage.

9. The timing calibration system according to claim 1, wherein the first charging signal and the second charging signal correspond to the same cycle of the data signal.

10. A timing calibration method, adapted to a memory read system comprising a memory, a delay unit and a data read circuit, wherein the memory outputs a data signal and a data latching signal, the delay unit is configured to delay the data latching signal according to a delay value, to generate a read signal, and the data read circuit is configured to read a data value of the data signal according to the read signal, and the timing calibration method comprises:
    generating a first charging signal and a second charging signal according to the data signal and the read signal;
    providing a resistor-capacitor charging unit to receive the first charging signal and the second charging signal, and perform charging according to the first charging signal and the second charging signal, so as to generate a first capacitor voltage and a second capacitor voltage;
    providing a comparing unit to compare the first capacitor voltage and the second capacitor voltage, to generate a comparison result; and
    adjusting the delay value of the delay unit according to the comparison result.

* * * * *